United States Patent
Kimmlingen et al.

(10) Patent No.: US 8,755,582 B2
(45) Date of Patent: Jun. 17, 2014

(54) METHOD AND DEVICE TO DETERMINE DISTORTION CORRECTION DATA

(75) Inventors: Ralph Kimmlingen, Nuremberg (DE); Sabrina Kreher, Erlangen (DE); Andreas Weidemann, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 1128 days.

(21) Appl. No.: 12/633,923

(22) Filed: Dec. 9, 2009

(65) Prior Publication Data

US 2010/0172560 A1 Jul. 8, 2010

(30) Foreign Application Priority Data

Dec. 10, 2008 (DE) .................. 10 2008 061 532

(51) Int. Cl.
 *A61B 6/03* (2006.01)
(52) U.S. Cl.
 USPC .................................................. 382/131
(58) Field of Classification Search
 CPC ........................................................ A61B 6/03
 USPC .................................. 324/300–324; 382/131
 See application file for complete search history.

(56) References Cited

U.S. PATENT DOCUMENTS

| | | | |
|---|---|---|---|
| 5,592,091 A | | 1/1997 | Manabe |
| 5,770,943 A | * | 6/1998 | Zhou ............................. 324/307 |
| 6,181,137 B1 | | 1/2001 | Havens et al. |
| 6,501,273 B2 | * | 12/2002 | Krieg et al. ................... 324/309 |
| 6,515,487 B1 | | 2/2003 | Dawson et al. |
| 2004/0113616 A1 | * | 6/2004 | Markl et al. .................. 324/307 |
| 2005/0024051 A1 | * | 2/2005 | Doddrell et al. .............. 324/307 |

FOREIGN PATENT DOCUMENTS

| | | |
|---|---|---|
| CN | 1416157 A | 5/2003 |
| CN | 101046506 A | 10/2007 |

OTHER PUBLICATIONS

Kanayama et al., In Vivo Rapid Magnetic Field Measurement and Shimming Using Single Scan Differential Phase Mapping, 1996, Magnetic Resonance in Medicine, vol. 36, pp. 637-642.*
Doran et al., A complete distortion correction for MR images: I. Gradient warp correction, 2005, Physics in Medicine and Biology, vol. 50, pp. 1343-1361.*
Jovicich et al., Reliability in multi-site structural MRI studies: Effects of gradient non-linearity correction on phantom and human data, 2006, NeuroImage, vol. 30, pp. 436-443.*

(Continued)

*Primary Examiner* — Toan Ton
*Assistant Examiner* — John Corbett
(74) *Attorney, Agent, or Firm* — Schiff Hardin LLP (57) ABSTRACT

In a method and device to determine distortion correction data for distortion correction of magnetic resonance images acquired with a magnetic resonance system, a starting spherical function is calculated represents the magnetic field of a gradient coil of the magnetic resonance system on the basis of the conductor geometry of the gradient coil. A three-dimensional parameter map is determined that represents a magnetic field generated by the gradient coil using a defined measurement subject, with a defined gradient strength being set for the appertaining gradient coil. A deviation parameter map is generated on the basis of the parameter map and on the basis of a reference parameter map which was determined with deactivated gradient coil. Spherical function coefficients of the gradient magnetic field are determined by fitting a spherical function representing the magnetic field of the gradient coil to the deviation parameter map using the starting spherical function. The distortion correction data are determined on the basis of the spherical function coefficients of the fitted spherical function.

16 Claims, 2 Drawing Sheets

(56) References Cited

OTHER PUBLICATIONS

Eccles et al, Temporal Spherical-Harmonic Expansion and Compensation of Eddy-Current Fields Produced by Gradient Pulses, 1993, Journal of Magnetic Resonance, Series A, vol. 103, pp. 135-141.*

"Use of Spherical Harmonic Deconvolution Methods to Compensate for Nonlinear Gradient Effects on MRI Images," Janke et al, Magnetic Resonance in Medicine, vol. 52 (2004) pp. 115-122.
"Image Distortion Correction in Magnetic Resonance Imaging Using Geodetic Techniques," Wilhelm, Doctoral Thesis, Stuttgart University (2004).

* cited by examiner

METHOD AND DEVICE TO DETERMINE DISTORTION CORRECTION DATA

BACKGROUND OF THE INVENTION

1. Field of the Invention

The invention concerns a method to determine distortion correction data for distortion correction of magnetic resonance images acquired with a magnetic resonance system, as well as a method to implement such a distortion correction. Moreover, the invention concerns a device to determine distortion correction data and a magnetic resonance system with such a device.

2. Description of the Prior Art

Magnetic resonance tomography is a widespread technique for acquisition of images of the inside of the body of a living examination subject. In order to acquire an image with this method, the body or a body part of the patient or test subject that is to be examined must initially be exposed to an optimally homogeneous, static basic magnetic field which is generated by a basic field magnet of the magnetic resonance system. During the acquisition of the magnetic resonance images, rapidly switched gradient fields that are generated by gradient coils are superimposed on his basic magnetic field for spatial coding. Moreover, radio-frequency pulses of a defined field strength are radiated into the examination subject with radio-frequency antennas. The nuclear spins of the atoms in the examination subject are excited by means of these radio-frequency pulses so as to be deflected by what is known as an "excitation flip angle" from their equilibrium state, parallel to the basic magnetic field. The nuclear spins then precess around the direction of the basic magnetic field. The magnetic resonance signals that are thereby generated are acquired (detected) by radio-frequency acquisition antennas. The magnetic resonance images of the examination subject are finally created on the basis of the acquired magnetic resonance signals. Each pixel in the magnetic resonance image is associated with a small body volume (known as a "voxel"), and every brightness or intensity value of the pixels is linked with the signal amplitude of the magnetic resonance signal that is received from this voxel.

The imaging properties of the magnetic field gradient coils are disadvantageously only approximately linear and one-to-one in the proximity of the isocenter of the basic magnetic field. This volume is designated as a "linearity volume" of the respective gradient coil. In many cases, however, the imaging volume is greater than the linearity volume of a physically realizable gradient coil. The non-ideal magnetic fields outside of the linearity volume therefore lead to imaging errors (typically called "distortions") in the imaging volume, which are noticeable in, for example, geometric deformations of the spin density images. Limitations thereby arise for such applications in which only slight deviations in the imaging fidelity are allowed, for example stereotaxy applications in the head region. Such deformations are also problematic given a merging of multiple images that image adjoining regions of the examination subject. For example, given a complete spinal column examination it is normally not possible to reconstruct a complete image of the entire spinal column with one measurement. Instead, images of the spinal column are acquired segment-by-segment and these images are subsequently merged to create the complete image. The distortions at the image edges then hinder the combination of the images.

In principle, distortions can be minimized with a subsequent distortion correction. For example, the gradient curve is thereby used for de-skewing in an image plane. In addition to this, a three-dimensional distortion correction is also possible in which additional image errors perpendicular to the image plane are corrected. A spherical function spectrum of the magnetic fields of the three axes of the gradient coil is a foundation for both the two-dimensional and the three-dimensional correction method. For this purpose, a solenoidal spherical volume of radius R in which rotation B disappears is considered. For this the magnetic field B at a location $r=r(r, \theta, \phi)$ within the sphere can be described by an expansion of the field according to orthogonal spherical functions $Y_{lm}$ up to the order N with the coefficients $a(l,m)$, $A(l,m)$ and $B(l,m)$, as follows:

$$\underline{B}(r, \theta, \varphi) = \qquad (1)$$

$$\sum_{l=0}^{N} \sum_{m=-l}^{+l} (a(l,m) \cdot r^l) \cdot Y_{lm}(\theta, \Phi) \text{ with the axial field components}$$

$$B_z(r, \theta, \varphi) = \sum_{l=0}^{N} \sum_{m=-l}^{-l} (r/R)^l \cdot P_{lm}(\cos\theta) \cdot [A_{lm}(\cos m\theta) + B_{lm}(\sin m\theta)]$$

The spherical functions $Yl_m$ are calculated from the associated Legendre polynomials $P_{lm}$ according to:

$$Y_{lm}(\theta, \Phi) = \sqrt{\frac{(2l+)(l-m)!}{4\pi \cdot (l+m)!}} \cdot P_{lm}(\cos\theta) \cdot \exp(im\theta) \qquad 2)$$

with $$P_{lm}(x) = \frac{(-l)^m}{2^l l!} (1-x^2)^{m/2} \cdot \frac{d^{l-m}}{dx^{l-m}} (x^2 - l)^l \qquad (3)$$

with $$(m = 0, \pm, \ldots \pm l)$$

For the following considerations it is sufficient to take into account the axial magnetic field component Bz (generally known as the field component in the direction of the basic magnetic field B0).

The following table shows as an example the spherical function expansion terms or, respectively, coefficients $A(l,m)$ and $B(l,m)$ for the first 5 expansion orders in the internal space of a cylindrical gradient coil:

| Expansion term | Association |
|---|---|
| A(0, 0) | Constant field ($B_0$ term) |
| A(1, 0) | Linear term in z-direction |
| A(1, 1) | Linear term in x-direction |
| B(1, 1) | Linear term in y-direction |
| A(3, 0) | 3rd order in z-direction |
| A(3, 1), A(3, 3) | 3rd order in x-direction |
| B(3, 1), B(3, 3) | 3rd order in y-direction |
| A(5, 0) | 5th order in z-direction |
| A(5, 1), A(5, 3), A(5, 5) | 5th order in x-direction |
| B(5, 1), B(5, 3), B(5, 5) | 5th order in y-direction |

For reasons of symmetry, in ideal gradient coils the terms with even order m in the x- and y-direction and all terms with m>0 in the z-direction (for the longitudinal gradient coil) disappear. For the previous distortion corrections, the expansion coefficients (and thus the magnetic field) have been calculated from the complicated conductor trace structures of the field coils, typically up to the expansion order N=13 (i.e. with l=0 through N). However, in this method production tolerances of the gradient coil have until now remained unconsidered. Such production tolerances lead to the situation that, in addition to the expansion orders calculated from the design, significant additional orthogonal terms occur that should actually not occur for reasons of symmetry. It is also the case that, for example, an x-gradient coil which should actually have only one A(1,1) linear term in the x-direction additionally also generates a B(1,1) term (i.e. a linear term in the y-direction) or a B(2,2) term.

The occurrence of such additional interference terms is more strongly pronounced in magnetic resonance systems with newer, thinner-walled gradient coils. A known method for precise determination of the coefficients is the exact measurement of the magnetic field of each field coil in the MR system. Measurements are thereby obtained with a magnetic field probe at a plurality of locations within the measurement space. Hundreds of measurement points that then serve as nodes for the additional determination of the spherical function coefficients are typical here. This measurement is connected with additional measurement and time costs in the start-up of an MR system, such that typically no individual magnetic field measurement is implemented in present magnetic resonance systems. If the magnetic field measurement should be implemented in customer systems that have already been installed, additional costs arise due to the necessary ordering of the measurement means by the service technician on site.

SUMMARY OF THE INVENTION

An object of the present invention is to provide a method and a device to determine distortion correction data, which allow a faster and more precise determination of distortion correction data for the gradient coil without complicated additional measurement means.

In the method according to the invention, at least the following method steps are implemented:

i) A starting spherical function representing the magnetic field of the appertaining gradient coil of the magnetic resonance system is calculated on the basis of the conductor geometry of the gradient coil. This starting spherical function corresponds, for example, to the theoretically calculated magnetic field spherical function whose data have previously been used for the distortion correction. It is sufficient when this calculation is implemented once for each gradient coil and the data for the respective user are supplied as well, as has also previously been the case.

ii) A three-dimensional parameter map is additionally determined using a defined measurement subject, for example a typical spherical phantom, wherein the respective parameter represents a magnetic field generated by the gradient coil. A defined gradient strength is thereby set for the appertaining gradient coil, meaning that the gradient coil is fed with current with a suitable current value.

iii) A deviation parameter map is then generated on the basis of the previously acquired parameter map and a reference parameter map. A reference parameter map is thereby a parameter map that was produced with a deactivated gradient coil but otherwise under conditions corresponding to those of the aforementioned parameter map for the respective gradient coil, i.e. with the same magnetic resonance sequence and using the same measurement subject at the same position etc. This reference parameter map can be generated before or after the parameter maps with set gradient current. In principle, it is also possible to use such a reference parameter map for multiple subsequent measurements in which, for example, parameter maps are acquired for different gradient coils in the x-, y- and z-direction.

iv) Spherical function coefficients of the gradient magnetic field are subsequently determined by fitting a spherical function representing the magnetic field of the gradient coil to the deviation parameter map, wherein the starting spherical function already explained above is used as a starting point for the fit process. For example, a least mean square fit or a similar method can be used for fitting the magnetic field spherical function.

v) The distortion correction data can then be determined on the basis of the spherical function coefficients of the fitted spherical function instead of the previous, typically used spherical function calculated only on the basis of the conductor geometry. The distortion correction data can thereby be the spherical function coefficients themselves, for example, but also distortion correction data calculated from these, for example a three-dimensional map of displacement vectors.

In the method according to the invention, improved spherical function coefficients are thus determined in a relatively simple manner via a magnetic resonance measurement with a phantom that is typically present at the user in any case, which also takes into account the interference terms caused by the production tolerances. The spherical function coefficients theoretically calculated only on the basis of the design can thereby be used as a basis for the determination of the spherical function coefficients. This has the advantage that the determination of the distortion correction data on the basis of the spherical function coefficients and also the additional method to implement the distortion correction according to the invention can largely ensue in the customary manner, wherein only the additional measurement with the phantom and the fit procedure must be implemented in order to acquire the improved distortion correction data and in order to use these in the distortion correction according to the invention.

In various test measurements, a significant improvement of the distortion correction could already be achieved with the method according to the invention given a consideration of the 0th through 3rd order of the additional interference terms. The time required for this for the measurement of the three-dimensional parameter maps and the additional calculation or, respectively, the fit process lies in the range of 10 to 20 min.

A device according to the invention to determine distortion correction data requires at least the following components:

i) A starting spherical function determination unit to acquire a starting spherical function representing the magnetic field of a gradient coil of the magnetic resonance system on the basis of the conductor geometry of the gradient coil. It can hereby be a calculation unit which independently calculates the starting spherical function. However, it can also be an interface which retrieves an already-calculated starting spherical function from a memory or over a network (for example from the manufacturer).

ii) A parameter map determination unit to determine a three-dimensional parameter map that represents a magnetic field generated by the gradient coil using a defined measurement subject, wherein a defined gradient strength is set for the appertaining gradient coil. Such a parameter map determination unit can, for example, likewise be an interface which, for example, accepts a parameter map determined by the magnetic resonance system or accepts corresponding raw data and generates a parameter map from these. Such a parameter map determination unit can, however, also comprise a suitable control unit (if it is directly installed in a magnetic resonance system controller), which control unit correspondingly activates the magnetic resonance system in order to measure the raw data to create the parameter maps. For example, it can be fashioned such that the magnetic resonance sequence that is optimal for the parameter map determination is emitted and the gradient coils are respectively fed with currents with the matching values. This parameter map determination unit can also be used in order to determine the reference parameter map that is acquired with gradient coils that are not fed with current.

iii) A deviation parameter map calculation unit to generate a deviation parameter map on the basis of the parameter map and a reference parameter map that would be determined with deactivated gradient coil.

iv) A coefficient determination unit to determine spherical function coefficients of the gradient magnetic field via fitting of a spherical function representing the magnetic field of the gradient coil to the deviation parameter map using the starting spherical function.

v) A correction data determination unit to determine the distortion correction data on the basis of the spherical function coefficients of the fitted spherical function.

A magnetic resonance system according to the invention can contain such a device according to the invention to determine the distortion correction data, for example as part of the image reconstruction unit. However, such a device can also be present as an independent component next to the image reconstruction unit in the magnetic resonance system and transfer the distortion correction data to the image reconstruction unit or a downstream distortion correction unit. The device to determine the distortion correction data can likewise be implemented completely independently on a suitable computer insofar as the corresponding interfaces are available in order to be able to determine the starting spherical function and the parameter maps and output the determined distortion correction data.

The predominant portion of the components of the device to determine the distortion correction data can in particular be realized wholly or at least partially in the form of software modules. This primarily applies for the deviation parameter map calculation unit, the coefficient determination unit and the correction data determination unit, which primarily implement calculations. However, the additional components (such as the starting spherical function determination unit or the parameter map determination unit) can also be realized (even if these are hereby interfaces) both as pure software modules (for example if the data can be accepted from other software components already realized on the same computer) and as hardware interfaces that are specially configured via software.

The invention therefore also encompasses a computer-readable medium that can be loaded directly into a memory of a programmable control device of the medical system and that is encoded with programming instructions to implement all steps of the method according to the invention when the program is executed in the control device. Such a realization as software is advantageous since medical systems that are already present can be retrofitted more easily in order to operate according to the method according to the invention.

As explained, the three-dimensional parameter map is to be selected so that it represents or, respectively, characterizes the respective magnetic field present at the location. In the simplest case, it is suitable to determine what is known as a three-dimensional "phase map" as a parameter map. The "phase" is the difference of the actual Larmor frequency (magnetic resonance frequency) measured at one location from the Larmor frequency expected at the respective location. This local Larmor frequency is proportional to the (normally measured) spin density and to the respective present magnetic field. The magnetic field present at the respective location can therefore also be calculated from the deviations of the measured Larmor frequency from the expected Larmor frequency (i.e. from the phase)since the phase change is the spatial derivation of the magnetic field. For this the measurement region in the acquisition of the three-dimensional phase map (i.e. in the measurement of the phantom) should advantageously be selected so that the phase relation between adjacent voxels is preserved and no phase overrun occurs. Methods for calculation of the magnetic field distribution using the phase are explained in DE 195 11 791 C1, for example.

Since phase and magnetic field intensity at the respective location can be converted into one another, in principle a spherical function can also be calculated that describes the phase depending on the location. The spherical function coefficients should then correspond to the spherical function coefficients that would be determined when the spherical function directly describes the magnetic field intensity depending on the location, as this is provided above by Equation (1).

Naturally, however, a spherical function as in Equation (1) can also be selected that directly describes the magnetic field intensity depending on the location. In this case there are various possibilities. For example, the phase map or, respectively, also the reference phase map can respectively be converted into a magnetic field intensity map. From this a magnetic field intensity deviation map can then be determined. However, it is likewise also possible to initially determine a deviation phase map and then to convert this into a magnetic field intensity deviation map. The latter has the advantage that a computer operation is less necessary since only a conversion of a phase map into an intensity map is required.

There are also various possibilities for the formation of the deviation parameter map. It is thus possible to generate a difference parameter map via determination of a difference between the respective parameter map and the reference parameter map. An additional possibility is to create a quotient parameter map as a deviation parameter map in that a quotient between the parameter map and the reference parameter map is determined. Such a quotient parameter map is a purely qualitative evaluation. This method is therefore simpler and more robust. In contrast to this, the generation of a difference parameter also comprises a quantitative evaluation, meaning that in principle the absolute value of the field can be determined. Such a measurement is, however, more complicated since it must be more precise and thus is also more error prone. It is preferred when a quantitative evaluation is desired.

It is appropriate to implement the method for multiple gradient coils that generate the magnetic field gradients in different spatial directions, i.e. for both the x-gradient coil and the y- and z-gradient coil. It is thereby possible to respectively use the same reference parameter map. The measurements of the parameter maps in the x-, y- and z-directions can, for example, be implemented in immediate succession, and all three parameter maps can then be used in parallel or succession in the respective steps of the conversion in order to calculate the respective interference terms for the individual gradient coils.

To increase the measurement precision, the interference field terms for multiple different gradient strengths of different polarities can be determined for every gradient axis. This mode of operation is, for example, advantageous for quantitative measurement of the gradient sensitivity ($A_{10}, A_{11}, B_{11}$). The ultimate value of the coefficients is advantageously determined via a linear fit.

In order to implement the method as quickly as possible, a fast, three-dimensional magnetic resonance measurement sequence is preferably used (for example the gradient echo sequence DESS (double echo steady state, see U.S. Pat. No.

4,825,159)) to determine the parameter map and/or to determine the reference parameter map.

In addition to the plain measurement times, the calculation time also plays a role in the total time duration of the method according to the invention, in particular for the determination of the spherical function coefficients via fitting of the spherical function to the deviation parameter map. Not only is the calculation consequently more precise with increasing expansion order, but also a longer calculation time is also required. It is advantageous for the user to predetermine the maximum expansion order and a calculation is implemented up to the selected calculation order. For this purpose, the device must have a user interface for input of a maximum expansion order value, and the coefficient determination unit is preferably fashioned so that the determination of spherical function expansion terms of the gradient magnetic field is implemented under consideration of the maximum expansion order value, meaning that the spherical function is expanded only up to the selected maximum expansion order. The user interface that is present anyway at the apparatus can thereby be used to input the maximum expansion order value. It is only required for a query for this purpose to be implemented by a suitable program. The input of a maximum expansion order value allows the user to himself select a suitable compromise between the total time and the precision for the respective individual case.

DESCRIPTION OF THE PREFERRED EMBODIMENTS

Figure 1:
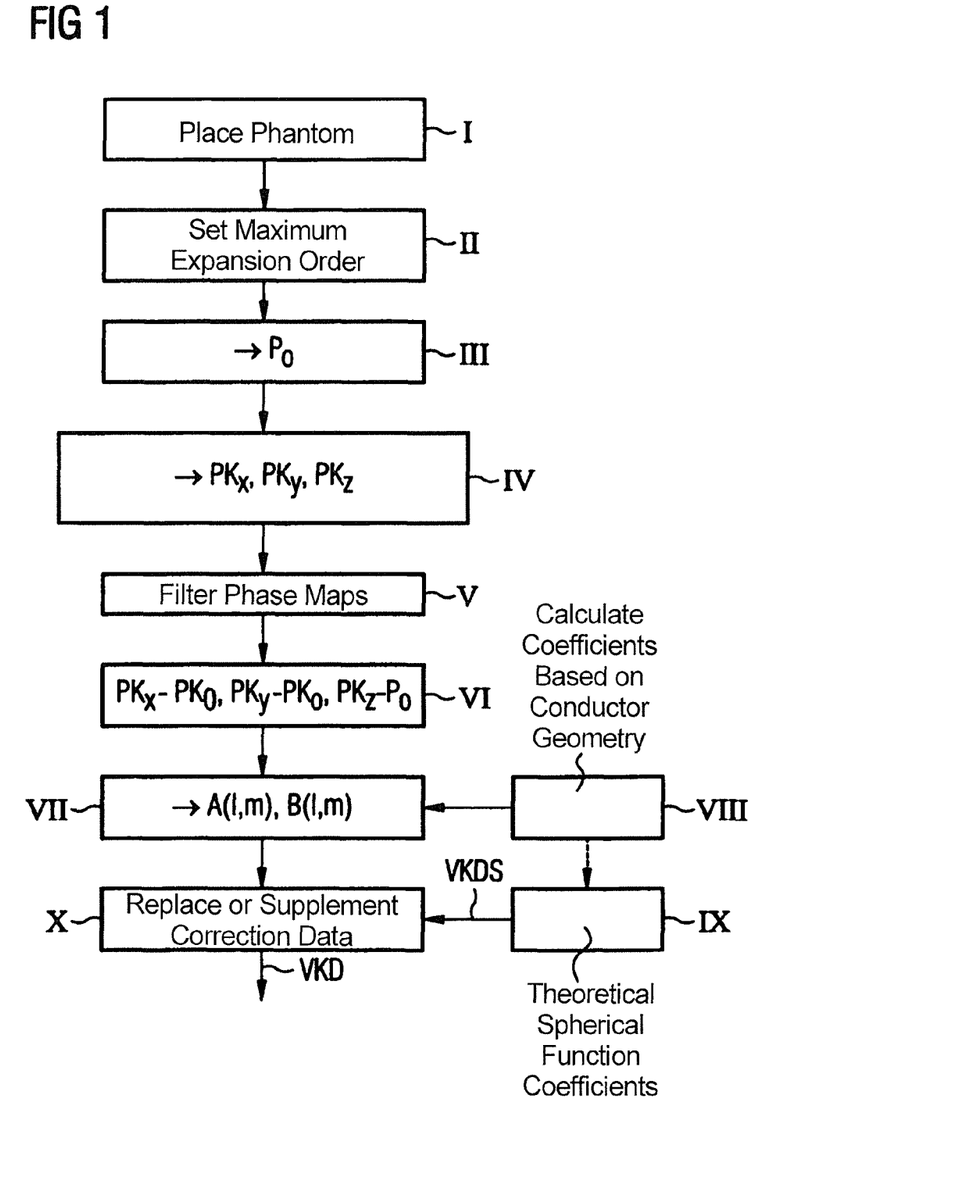
FIG. 1 is a flowchart of an embodiment of the method according to the invention to determine distortion correction data.

In the method shown in FIG. 1, all gradient coils are calibrated in one pass in order to then determine the spherical function coefficients and the distortion correction data based on these coefficients. Without limitation of generality, it is assumed that the phase maps already explained above are determined as parameter maps.

The method initially begins in Step I by positioning that a measurement phantom in the measurement space of the magnetic resonance scanner. This measurement phantom can be, for example, a spherical phantom, an ellipsoidal phantom, a cylindrical phantom or the like. A spherical phantom is advantageously used. The phantom is fashioned in a typical manner, for example is simply filled with water.

The maximum expansion order can be predetermined by the user in Step II. Moreover, at this point he can additionally also select the matrix size and the imaging volume (field of view=FoV). The matrix size indicates the number of voxels in the FoV, i.e. the resolution of the 3D map. For example, given use of a spherical phantom 24 cm in diameter a matrix size of 64 and a FoV of 350 mm can be selected. Each voxel then has an edge length of 5.4 mm. These data, and in particular the maximum expansion order, ultimately determine the measurement time. It has proven to be the case that a significant improvement of the distortion correction data is achieved with an expansion order of N=12 given the aforementioned data.

Alternatively, it is possible to set the program so that the user can simply select only the maximum available measurement time, and then the optimal voxel count and expansion order for the available measurement time are automatically selected. It is possible for the selected data to be initially displayed to the user for confirmation.

A reference measurement without current feed of the gradient axes then ensues in Step III, meaning that the reference phase map $PK_0$ is acquired. This measurement ensues with a three-dimensional gradient echo sequence, for example, as it is also used in most magnetic resonance apparatuses to check the basic magnetic field homogeneity for apparatus clearance. However, other magnetic resonance sequences for measurement of the phase map are also possible, for example a spin echo sequence. However, the gradient echo sequence has the advantage that is it normally faster.

In the next Step IV the phase maps $PK_x$, $PK_y$, $PK_z$ for the three gradient coils are then acquired in succession in the x-, y- and z-direction. For example, first the x-gradient coil is fed with current and the phase map $PK_x$ for this gradient coil is acquired; the y-gradient coil is subsequently fed with current, and then the z-gradient coil. In all of these measurements the same magnetic resonance sequence is used as in the reference measurement in Step III. Moreover, all settings are identical.

In all measurements, i.e. both in the acquisitions of the phase maps $PK_x$, $PK_y$, $PK_z$ and in the acquisition of the reference phase map $PK_0$, the following is advantageously to be noted:

i) The phase relationship between the adjacent voxels should be maintained, meaning that the parameters are to be selected so that no phase overrun occurs.

ii) The spatial resolution, i.e. the voxel size or, respectively, matrix size, should be selected so that it matches the highest expansion order according to the Shannon theorem.

iii) The measurement precision should be selected so that it lies in the tenth-of-a-percent range, i.e. so that 0.1% of the interference term amplitude can be safely detected. For example, the measurement repetition precision should lie below 0.2 ppm. Since the raw data precision is 12-bit, a measurement with a precision in the tenth-of-a-percent range is possible.

The phase maps $PK_x$, $PK_y$, $PK_z$ and $PK_0$ are then initially checked and filtered again in Step V. For example, unusable voxels can thereby be discarded due to a possible, unavoidable phase overrun, or voxels from regions in which the signal-to-noise ratio was too poor can be discarded.

Respective difference phase maps are then determined as deviation parameter maps from the phase maps in Step VI, i.e. the reference phase map $PK_0$ is respectively subtracted from the determined phase maps $PK_x$, $PK_y$, $PK_z$. This ensues for all phase maps, i.e. for every gradient coil and every measured gradient strength.

The calculation of the spherical function coefficients then ensues in Step VII via a fitting of a spherical function, wherein the difference phase maps can also be converted into difference magnetic field intensity maps in this Step VII, and then a fitting of the magnetic field spherical function ensues as it is described by Equation (1), for example. A least mean square method can be used as a fit method, for example. A spherical function with coefficients is used as they have previously been calculated purely on the basis of the geometric design of the gradient coils. For example, this can have ensued at an arbitrary preceding point in time in Step VIII.

The improved spherical function coefficients determined in Step VII are then used in Step X in order to replace and/or to supplement the existing distortion correction data VKDS and thus to generate the improved distortion correction data that are then stored for a later distortion correction or are directly transferred to a distortion correction unit. The previous distortion correction data VKDS used for this can, for example, have been previously determined in a typical manner on the basis of the purely theoretical spherical function coefficients (see Step IX).

Figure 2:
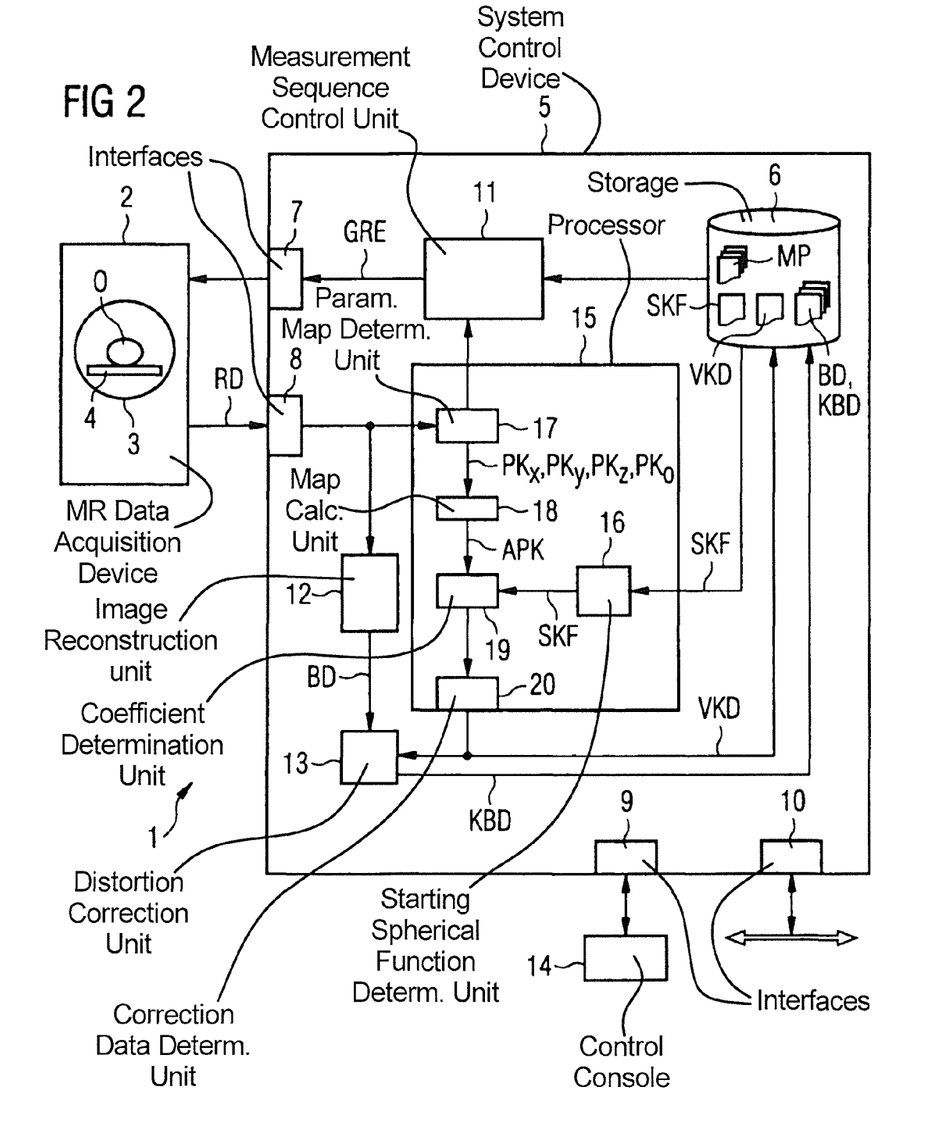
FIG. 2 is a schematic illustration of a magnetic resonance system with a device according to the invention to determine distortion correction data.

A typical magnetic resonance system 1 is shown in FIG. 2, in which the system control device 5 is modified in a suitable manner so that the magnetic resonance system 1 has a processor 15 according to the invention to implement the method according to the invention.

A core of this magnetic resonance system 1 is an MR data acquisition device 2 (also called a "tomograph" or "scanner") in which a phantom O for this measurement is positioned here on a bed 4 in a measurement space 3. A radio-frequency antenna to emit the magnetic resonance radio-frequency pulses, a basic field magnet and suitable gradient coils in order to set the necessary magnetic field gradients are located (not shown) within the tomograph 2. The tomograph 2 is activated by a system control device 5, which here is shown separately. A control console (terminal) 14 is connected to the system control device 5 via an interface 9, which terminal 14 serves as a user interface via which an operator operates the system control device 5 and therefore the tomograph 2. The system control device 5 has a bulk storage 6 that serves to store image data KBD acquired by means of the magnetic resonance data acquisition device 2, for example, or measurement protocols MP for the automatic workflow control during a measurement.

The system control device 5 furthermore has a tomograph interface 7, which is connected with the tomograph 2 and which outputs the radio-frequency pulses with the suitable amplitudes and phases corresponding to a measurement protocol MP predetermined by means of the system control device 5 and outputs the matching gradient pulses to implement a specific measurement to the matching components of the tomograph 2. The control of the measurement sequences on the basis of the predetermined measurement protocols MP thereby ensues by means of a measurement sequence control unit 11. The operator can communicate with this measurement sequence control unit 11 with the aid of the terminal 14 and thus call specific measurement protocols MP and, if necessary, alter them or even provide new measurement protocols MP.

Moreover, the system control device 5 is connected with the tomograph 2 via an acquisition interface 8. The raw data RD arriving from the tomograph 2 are acquired via the acquisition interface 8, which raw data RD are reconstructed into the desired magnetic resonance images in an image reconstruction unit 12.

The tomograph interface 7 and the acquisition interface 8 are hereby represented in a very simplified manner. It is clear that these interfaces comprise a plurality of transceivers or receivers that are typically necessary in order to emit the radio-frequency signals, to switch the gradient coils in the correct order (sequence) etc. or in order to read out the different acquisition coils in a matching manner and to additionally process (for example to digitize) their signals.

The entire magnetic resonance system 1 moreover also has all additional typical components or, respectively, features, for example an interface 10 for connection to a communication network, for example an image information system. However, these components that are not necessary for the understanding of the invention are not all shown in FIG. 2 for better clarity.

Here a distortion correction device 13 is downstream of the image reconstruction device 12, which distortion correction device 13 initially subjects the image data BD generated by the image reconstruction device 12 to a distortion correction so that the distortion-corrected image data KBD are then stored in a mass storage 6, for example. Naturally, it is also possible to store not only the corrected image data KBD but also the image data BD itself there. It is likewise also possible that the distortion correction device is part of the image reconstruction device 12, or that this distortion correction device calls the image data BD stored in the mass storage 6 later and subjects it to a distortion correction when this is initiated by an operator via the terminal 14, for example.

To implement the distortion correction, the distortion correction unit 13 requires distortion correction data VKD. These are generated here, by a correction data generation unit 15 and provided directly to the distortion correction unit 13 or stored in the bulk storage 6 from when the distortion correction unit 13 can then retrieve the data.

Here the correction data generation unit 15 is completely implemented in the form of software modules on a processor (not shown) within the system control device 5 and possesses different sub-modules. Among these is a parameter map determination unit 17 which serves to generate the parameter maps $PK_x$, $PK_y$, $PK_z$ and the reference parameter map $PK_0$ in the predetermined manner. For example, a control command can be output by this parameter map determination unit 17 to the measurement sequence control unit 11, which thereupon emits a suitable gradient echo sequence GRE and outputs suitable commands via the tomograph interface 7 in order to properly feed current to the respective gradient coil.

The phantom O was previously positioned by the operator at the correct point in the measurement space 3, and the operator also has the possibility (as this was already explained) to enter corresponding inputs via the terminal 14 in order to predetermine the parameters for the measurement such as voxel size or density, or type of sequence that is used, or number of the maximum expansion terms etc., and to initiate the measurement via the parameter map determination unit 17.

After all necessary parameter maps $PK_x$, $PK_y$, $PK_z$ for the three gradient coils as well as a reference map $PK_0$ have been acquired by the parameter map determination unit 17, these are passed to a deviation parameter map calculation unit 18 which (for example) generates the different difference phase maps as deviation parameter maps APK as described above and then passes these to a coefficient determination unit 19. As explained above, this uses a starting spherical function SFK that was calculated purely on the basis of the geometric design of the individual gradient coils. For example, this starting spherical function SFK can be generated beforehand by a starting spherical function determination unit 16 or have been retrieved from the bulk storage 6 in which the starting spherical function has already been stored for the magnetic resonance system by the manufacturer. However, it is also possible that the starting spherical function determination unit 16 calls the starting spherical function SFK via the interface 10 via an external network, for example from the manufacturer if no starting spherical function is present on site.

The spherical function expansion coefficients $A(l,m)$, $B(l,m)$ determined in the coefficient determination unit 19 are passed to the correction data determination unit 20 that generates the distortion correction data VKD on the basis of these spherical function coefficients and either passes them to the distortion correction unit 13 and/or stores these data in a mass storage 6.

Both the system control device 5 and the terminal 14 can also be integral components of the tomograph 2. However, the system control device 5 can likewise also consist of multiple individual components. In particular, for example, the mass storage 6 can be connected with the system control device 5 just like the terminal 14 via an interface instead of being integrated into this.

Moreover, it is also possible that the correction data generation unit 15 and/or the distortion correction unit 13 are also implemented externally, for example on an image computer connected via the network, in order to only implement a distortion correction of the image data BD later if this should be necessary. In this case, it should be ensured that corresponding raw data from the magnetic resonance system are provided for the generation of the parameter maps $PK_x$, $PK_y$, $PK_z$, $PK_0$, meaning that it would have to then be ensured— either automatically via a suitable unit or via selection of corresponding measurement protocols by the operator—that suitable measurement sequences are acquired with matching switched gradient coils and phantom O positioned at the correct point, and these data are then provided to the correction data generation unit. The parameter map determination unit 17 of such an external correction data generation unit is then advantageously fashioned so that it generates the desired parameter maps $PK_x$, $PK_y$, $PK_z$, $PK_0$ from the raw data provided in the respective measurements, for example as described above.

Although modifications and changes may be suggested by those skilled in the art, it is the intention of the inventors to embody within the patent warranted hereon all changes and modifications as reasonably and properly come within the scope of their contribution to the art.

We claim:

1. A method to determine distortion correction data for distortion correction of a magnetic resonance image acquired by a magnetic resonance system, using a gradient coil, formed by a coil conductor, in said magnetic resonance system, comprising the steps of:
    (a) in a processor, calculating a starting spherical function representing a magnetic field produced by said gradient coil, based on conductor geometry of the coil conductor of the gradient coil;
    (b) in said processor, determining a three-dimensional parameter map that represents a magnetic field generated by the gradient coil using a defined measurement subject, with a defined gradient strength set for the gradient coil;
    (c) in said processor, generating a deviation parameter map, representing deviations between the parameter map and a reference parameter map provided to the processor, obtained with the gradient coil deactivated;
    (d) in said processor, determining spherical function coefficients of the gradient magnetic field by fitting a spherical function representing the magnetic field of the gradient coil to the deviation parameter map, using the starting spherical function; and
    (e) in said processor, determining distortion correction data from the spherical function coefficients of the fitted spherical function, and making said distortion correction data available in electronic form in a format for correcting said magnetic resonance image.

2. A method as claimed in claim 1, comprising determining a phase map as said parameter map.

3. A method as claimed in claim 2, comprising determining the spherical function to describe the phase depending on location.

4. A method as claimed in claim 2, comprising determining the spherical function to describe the magnetic field intensity depending on location.

5. A method as claimed in claim 2, comprising converting the phase map and/or the reference phase map into a magnetic field intensity map.

6. A method as claimed in claim 2, comprising determining a deviation phase map from said phase map and converting said deviation phase map into a magnetic field intensity deviation map.

7. A method as claimed in claim 1, comprising forming a deviation parameter map in said processor as a difference between the parameter map and the reference parameter map.

8. A method as claimed in claim 1, comprising forming a deviation parameter map in said processor as a quotient between the parameter map and the reference parameter map.

9. A method as claimed in claim 1, comprising executing each of steps (a), (b), (c), (d) and (e) respectively for each of multiple gradient coils that generate magnetic field gradients in different spatial directions.

10. A method as claimed in claim 1, comprising implementing a three-dimensional magnetic resonance measurement sequence to determine the parameter map and/or the reference parameter map.

11. A method as claimed in claim 1, comprising implementing a gradient echo sequence to determine the parameter map and/or the reference parameter map.

12. A method for correcting distortion of a magnetic resonance image acquired by a magnetic resonance system, using a gradient coil, formed by a coil conductor, in said magnetic resonance system, comprising the steps of:
    determining distortion correction data by:
    (a) in a processor, calculating a starting spherical function representing a magnetic field produced by such gradient coil, based on conductor geometry of the coil conductor of the gradient coil;
    (b) in said processor, determining a three-dimensional parameter map that represents a magnetic field generated by the gradient coil using a defined measurement subject, with a defined gradient strength set for the gradient coil;
    (c) in said processor, generating a deviation parameter map, representing deviations between the parameter map and a reference parameter map, provided to the processor, obtained with the gradient coil deactivated;
    (d) in said processor, determining spherical function coefficients of the gradient magnetic field by fitting a spherical function representing the magnetic field of the gradient coil to the deviation parameter map using the starting spherical function;
    (e) in said processor, determining distortion correction data from the spherical function coefficients of the fitted spherical function; and
    in said processor, correcting distortion of said magnetic resonance image using said distortion correction data, to produce a distortion-corrected magnetic resonance image, and making said distortion-corrected magnetic resonance image available in electronic form, as a data file, at an output of the processor.

13. A device to determine distortion correction data for distortion correction of a magnetic resonance image acquired by a magnetic resonance system, using a gradient coil, formed by a coil conductor, in said magnetic resonance system, comprising:
    a processor system configured to calculate a starting spherical function representing a magnetic field produced by said gradient coil, based on conductor geometry of the coil conductor of the gradient coil;
    said processor system being configured to determine a three-dimensional parameter map that represents a magnetic field generated by the gradient coil using a defined measurement subject, with a defined gradient strength set for the gradient coil;

said processor system being configured to generate a deviation parameter map, representing deviations between the parameter map and a reference parameter map provided to the processor, obtained with the gradient coil deactivated;

said processor system being configured to determine spherical function coefficients of the gradient magnetic field by fitting a spherical function representing the magnetic field of the gradient coil to the deviation parameter map using the starting spherical function; and said processor system being configured to determine distortion correction data from the spherical function coefficients of the fitted spherical function, and to make said distortion correction data available in electronic form in a format for correcting said magnetic resonance image.

14. A device as claimed in claim 13 comprising an interface for said coefficient determination unit that allows a maximum expansion order value to be entered into said coefficient determination unit, and wherein said coefficient determination unit is configured to determine said spherical function coefficients by implementing a spherical function expansion of terms of said gradient magnetic field dependent on said maximum expansion order value.

15. A magnetic resonance apparatus comprising:

a magnetic resonance data acquisition unit adapted to interact with a patient to acquire magnetic resonance data from the patient, said magnetic resonance data acquisition unit comprising a gradient coil, formed by a coil conductor that generates a magnetic field during acquisition of said magnetic resonance data;

a processor system supplied with said magnetic resonance data, said processor system being configured to (a) calculate a starting spherical function representing a magnetic field produced by said gradient coil based on conductor geometry of the coil conductor of the gradient coil, (b) determine a three-dimensional parameter map that represents a magnetic field generated by the gradient coil using a defined measurement subject, with a defined gradient strength set for the gradient coil, (c) generate a deviation parameter map, representing deviations between the parameter map and a reference parameter map, provided to the processor, obtained with the gradient coil deactivated, (d) determine spherical function coefficients of the gradient magnetic field by fitting a spherical function representing the magnetic field of the gradient coil to the deviation parameter map using the starting spherical function, and (e) determine distortion correction data from the spherical function coefficients of the fitted spherical function, and make said distortion correction data available in a form for correcting said magnetic resonance images; and an image reconstruction computer, supplied with said distortion correction data, configured to reconstruct a distortion-corrected magnetic resonance image of the subject using said magnetic resonance data and said distortion correction data, and to make said distortion-corrected magnetic resonance image available in electronic form, as a data file, at an output of the processor.

16. A non-transitory computer-readable medium encoded with programming instructions, said medium being loaded into a processor system of a magnetic resonance system for distortion correction of a magnetic resonance image acquired by the magnetic resonance system, using a gradient coil, formed by a coil conductor, in said magnetic resonance system, said programming instructions causing said processor system to:

(a) calculate a starting spherical function representing a magnetic field produced by said gradient coil, based on conductor geometry of the coil conductor of the gradient coil;

(b) determine a three-dimensional parameter map that represents a magnetic field generated by the gradient coil using a defined measurement subject, with a defined gradient strength set for the gradient coil;

(c) generate a deviation parameter map, representing deviations between the parameter map and a reference parameter map provided to the processor, obtained with the gradient coil deactivated;

(d) determine spherical function coefficients of the gradient magnetic field by fitting a spherical function representing the magnetic field of the gradient coil to the deviation parameter map using the starting spherical function; and (e) determine distortion correction data from the spherical function coefficients of the fitted spherical function, and make said distortion correction data available in electronic form in a format for correcting said magnetic resonance image.

* * * * *